United States Patent
Nee et al.

[11] Patent Number: 5,885,893
[45] Date of Patent: Mar. 23, 1999

[54] IMPACT-FREE WIRE BONDING OF MICROELECTRONIC DEVICES

[75] Inventors: Coeyen Nee; Jeff Chang; C. James Hwang, all of Hsin-Chu; Tze-Ping Chen, Chung-Tung, all of Taiwan

[73] Assignee: Highlight Optoelectronics, Inc., Hsin-Chu, Taiwan

[21] Appl. No.: 871,126

[22] Filed: Jun. 9, 1997

[51] Int. Cl.$^6$ ...................................................... H01L 21/44
[52] U.S. Cl. .............................. 438/617; 438/25; 438/123
[58] Field of Search ....................................... 438/617, 123, 438/25, 26

[56] References Cited

U.S. PATENT DOCUMENTS

| | | | |
|---|---|---|---|
| 4,209,358 | 6/1980 | DiLeo et al. | 438/26 |
| 4,994,412 | 2/1991 | Kalfus et al. | 438/123 |
| 5,338,704 | 8/1994 | Imai et al. | 438/26 |
| 5,366,692 | 11/1994 | Ogashiwa | 438/617 |
| 5,393,705 | 2/1995 | Sonobe | 438/123 |
| 5,518,957 | 5/1996 | Kim | 438/123 |

*Primary Examiner*—Kevin M. Picardat
*Attorney, Agent, or Firm*—H. C. Chan

[57] ABSTRACT

A stress-free and non-impact method of creating interconnects between electronic devices and electrodes is disclosed. A first conductive paste is deposited on one electrode. An electronic device, such as a dice, is attached to the electrode using the conductive paste. A second conductive paste is applied to the top surface of the dice and a third conductive paste is applied to another electrode. A conductive wire is deposited to the second and the third conductive paste. After curing, the two electrodes are connected to the dice. There is no impact required in creating the interconnect.

14 Claims, 6 Drawing Sheets

5,885,893

IMPACT-FREE WIRE BONDING OF MICROELECTRONIC DEVICES

FIELD OF THE INVENTION

The present invention relates to wire-bonding of microelectronic devices, and more particularly, to methods (and devices resulted therefrom) of providing a stress-free and nonimpact bonding of microelectronic devices.

BACKGROUND OF THE INVENTION

Device miniaturization has been the current trend in many areas of technology, such as electronics, semiconductor, optoelectronics and mechanics. This means that components (which are made from combination of these devices) are also miniaturized. However, there are many problems in miniaturization, and they demand novel technological solutions. From an electromechanical viewpoint, miniaturization often implies rearrangement of electrical interconnects among devices. When the interconnects are done by traditional wire-bonding, the stress within the working area increases rapidly as the bonding area shrinks, which eventually surpasses the yield strength of the base plate material and causes bending, cracking and/or structural damages. For compound semiconductors (e.g. III–V, II–VI,) this kind of damages often cause defect or deformation in the interface structure and alter the device characteristics. In most case, the device would lose its normal function or even become inoperable as a result of the defect or deformation.

SUMMARY OF THE INVENTION

Based on the above discussion, it is desirable to have a method of device interconnection that is stress-free and non-impact. This invention exploits the adhesive force between a conductive lead wire and a conductive paste-like material applied on top of electrodes at or close to room temperature. When the paste is dried, the lead wire is secured and bonded to the electrode to be connected. As a result, the electrodes are connected and become conductive without any impact, pressure and vibration action used in many traditional wire-bonding machines. In addition, the operation does not require that the devices under work be exposed to high temperature (i.e., >200° C.). The lead wire can be gold, silver, copper, aluminum and nickel, or other wire materials coated with these metals. The conductive paste-like material can be a gold paste, a silver paste, a conductive polymer, etc.

These and other features and advantages of the present invention are described by the following detailed description of the preferred embodiments together with the accompanying drawings.

DETAILED DESCRIPTION OF THE INVENTION

Figure 1A:
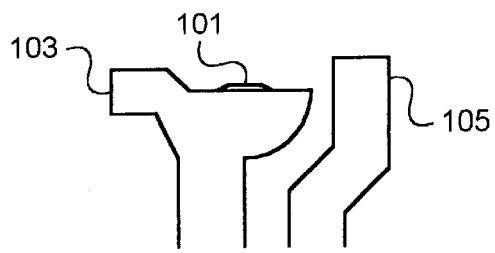
FIGS. 1A–1G show the various stages in one embodiment of the method of the present invention.
Figure 1B:
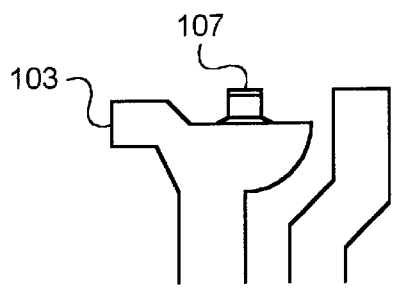
Figure 1C:
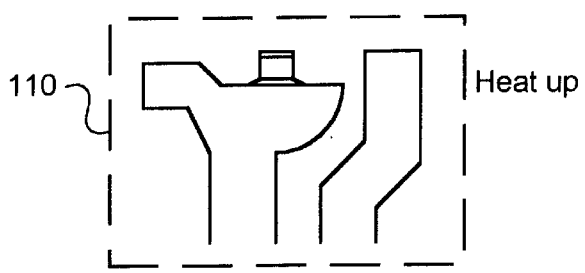
Figure 1D:
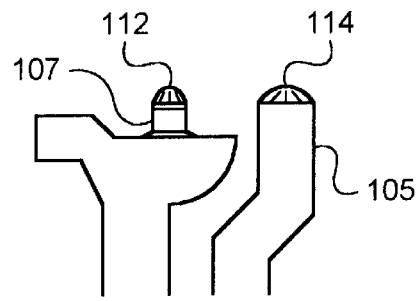
Figure 1E:
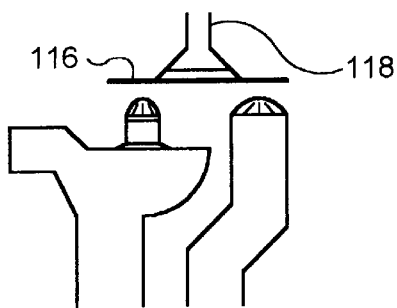
Figure 1F:
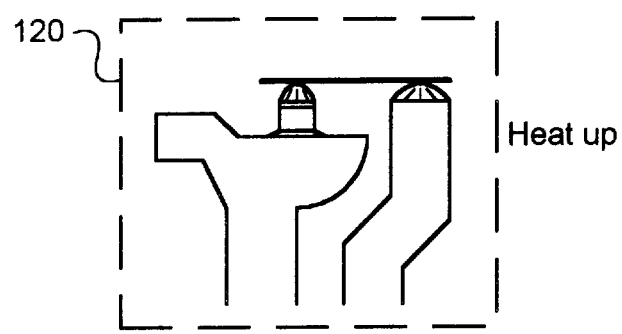
Figure 1G:
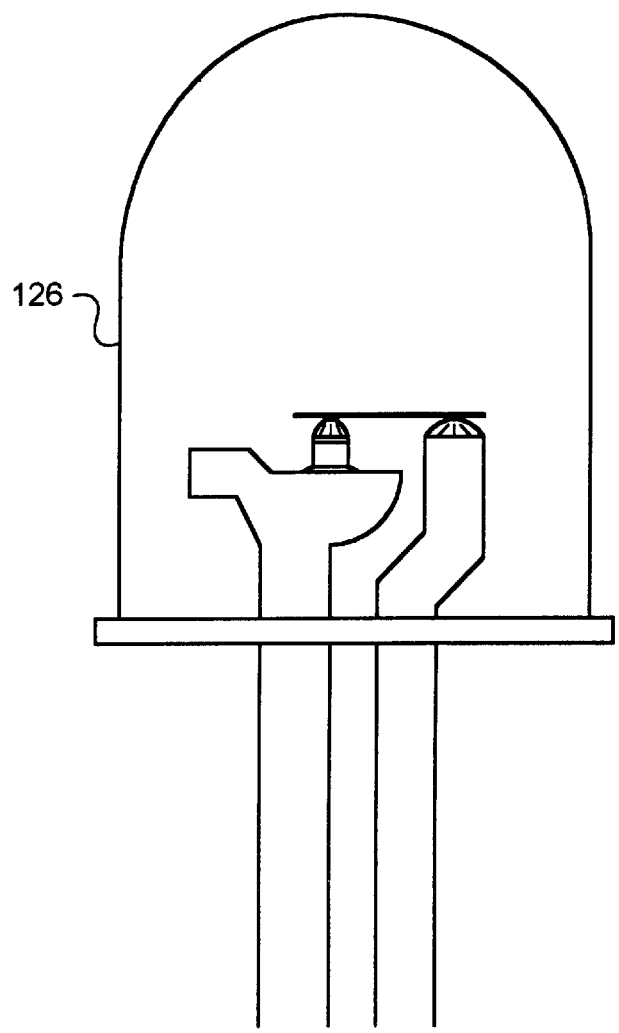

The present invention involves a stress-free, non-impact method of creating electrode interconnects. This invention overcomes the problems and limits of device miniaturization brought about by prior art wire-bonding approaches, especially those applied in semiconductor industry. This invention is applicable to any interconnects bonded by wires. Examples of applicable devices are integrated circuits (ICs), light emitting diodes (LEDs), laser diodes (LDs), field emitting transistors (FETs), photo diodes (PDs), photo transistors (PTs), and even capacitors or sensors, to name just a few. The geometry of the object under work can be a plate, a dice, or a bar.

The present invention has the following advantages compared to prior art wire-bonding methods: (1) utilize commonly available machinery, facility and peripheral tools and materials; (2) avoid the use of expensive wire-bonding equipment; (3) has less constraint on the device dimension; (4) do not cause any stress, defect and damage in the device; (5) operate under a relatively low temperature (<180° C.); (6) is easy to rework; and (7) offer flexibility in the process and ease of manipulation in modification and adjustment of devices.

A first example of the application of the above invention is shown in FIGS. 1A–1G. This example demonstrates the process of providing connection between a dice (e.g., LED, LD, etc.) and a lead frame.

Step 1: Apply a conductive silver paste 101 on one stand 103 of a lead frame (see FIG. 1A). The lead frame has another stand 105.

Step 2: An LED dice 107 of arbitrary type and dimension is attached (with the correct polarity) on stand 103 of the frame using silver paste 101 in accordance with standard procedure (see FIG. 1B).

Step 3: The lead frame (with dice attached) is placed in an oven 110 for curing paste 101 to solidify dice 107 (see FIG. 1C). The temperature of oven 110 is preferably less than 150° C.

Step 4: Apply an appropriate amount of silver paste 112 onto the top face of dice 107 and an appropriate amount of silver paste 114 on stand 105 of the frame (see FIG. 1D). The paste drop 112 on dice 107 will become ball-shaped due to the surface tension. The contact area of the ball with dice 107 can be adjusted by controlling the viscosity of the paste, and its size by changing the drop amount. Generally, a ball diameter of less than 150 $\mu$m is desirable and is more preferable if kept under 100 $\mu$m. As for paste 114 on stand 105, no obvious constraint on the amount and size is needed due to a sufficient amount of workable area. Silver paste 112 and 114 preferably have as high a solid loading as possible so that a highest solid-to-solid contact area can be achieved among the silver particles. The paste can also be made of particles of gold, nickel, or non-metallic particles coated with the these metals. It can even be an organic matter, such as a conductive polymer.

Step 5: Before pastes 112 and 114 solidify, pick up a conducting wire 116 with a fixture 118. Wire 116 is positioned across the two paste drops 112 and 114 such that wire 116 aligns with the center of each paste drop 112 and 114 (see FIG. 1E). Hold down fixture 118 so that wire 116 reaches and is partially submersed into silver paste drops 112 and 114. Fixture 118 then releases wire 116. Fixture 118 can now be used to perform other tasks.

Step 6: The lead frame-dice-wire assembly is placed in an oven 120 (see FIG. 1F). The electrical connection between dice 107 and the lead frame is achieved after the paste is cured. The temperature of the oven could be as high as 300° C. However, curing is preferably being carried out at 150° C. or lower.

Step 7: The assembly is removed from oven 120. It is enclosed by a transparent enclosure 126 (see FIG. 1G).

In the above example, depending on the dice size, wire 116 can have a diameter as large as 200 $\mu$m, with 50~100 $\mu$m producing the best effect. The length of wire 116 depends on the actual separation between the two stands (103, 105) of the lead frame. The typical length is between 1 to 2.5 mm. Sometimes, it can be as large as 5 mm. It should be noted that the smallest distance would be limited by the size of the tip of the fixture required to hold the wire.

Note that the height of the two stands of the lead frame described above is preferably made different. For example, stand 103 (i.e., the one on which dice 107 stands) is shorter than stand 105 by the height of one dice. Once the dice is mounted, wire 116 can be held in a horizontal orientation. This could simplifies the wire-laying action in step (5).

Figure 2:
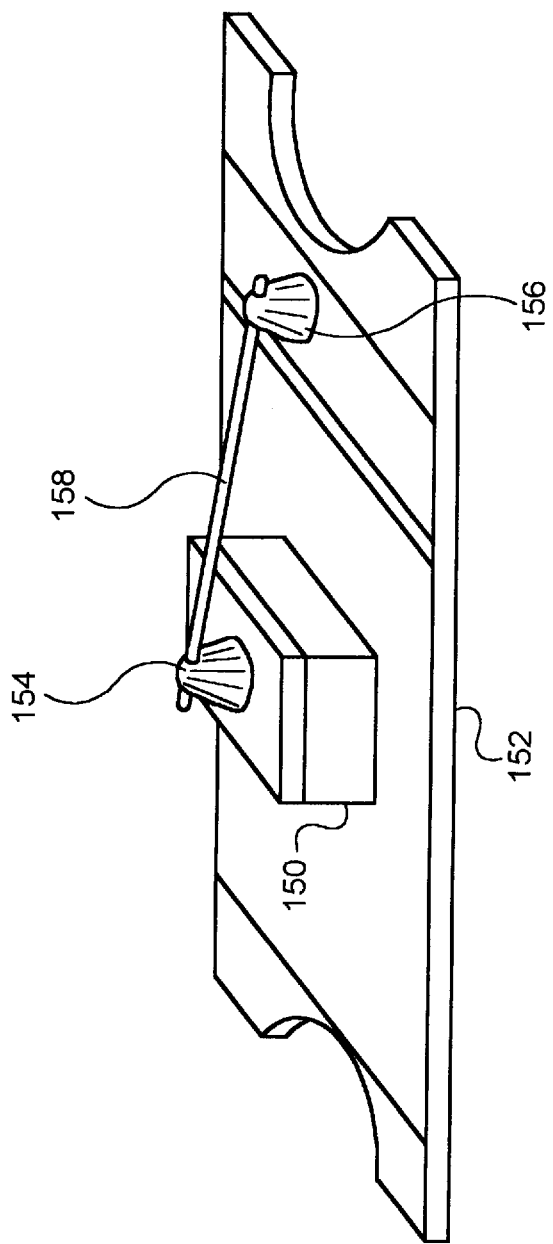
FIG. 2 shows applying the present invention to connect a dice to a circuit board.

The process described above can be used to bond a dice to a circuit board (e.g., PC board). This is illustrated as a second example, shown in FIG. 2. A dice 150 is attached to a circuit board 152. A conductive silver paste 154 is deposited on top of dice 150 and a conductive silver paste 156 is deposited on circuit board 152. A wire 158 is bonded to dice 150 and circuit board 152 using the above described method.

Figure 3A:
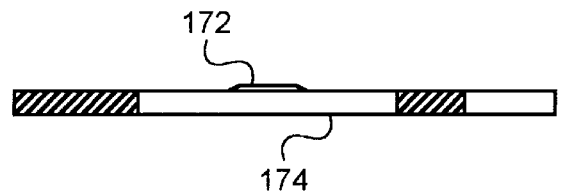
FIGS. 3A–3F show the various stages of an embodiment of the present invention combining conventional bonding with the method of the present invention.

A method combining the non-impact, wire-bonding method of the present invention with the conventional wire-bonding mechanism is now described. The steps of this third example are:

Step 1: Deposit a conductive silver paste 172 on a surface of a first electrode 174 (see FIG. 3A).

Figure 3B:
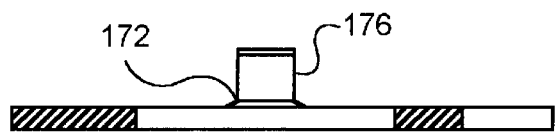

Step 2: Attach a dice 176 onto electrode 174 using silver paste 172 (see FIG. 3B)

Figure 3C:
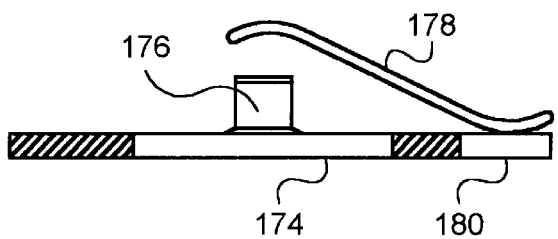
Figure 3D:
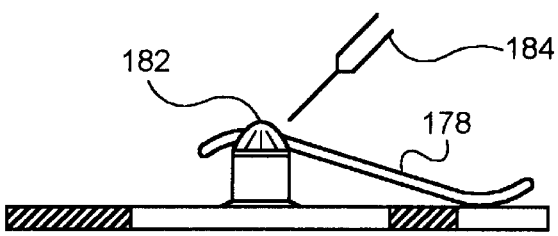
Figure 3E:
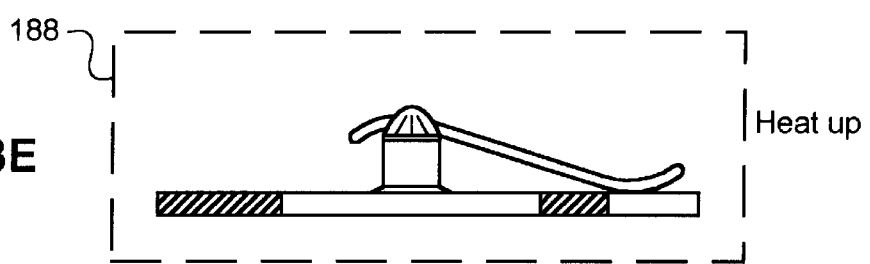
Figure 3F:
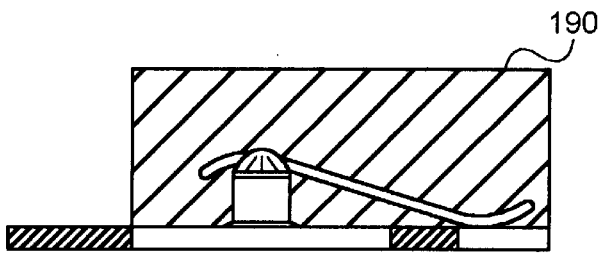

Step 3: Use a conventional wire-bonding machine to attach one end of a lead wire 178 (gold or aluminum) onto the surface of another electrode 180. Wire 178 is then pulled towards dice 176 and across its center area. Wire 178 should not have any physical contact with the surface of dice 176. Carefully cut off wire 176 to let it suspend right above dice 176, preferably by less than 2 mm (see FIG. 3C).

Step 4: Apply a silver paste 182 from the top of lead wire 178 and let both paste 182 and wire 178 adhere to the surface of dice 176 by pressing with a tool 184 (see FIG. 1D).

Step 5: Once wire 178 is secured on dice 176, cure pastes 172 and 182 using an oven 188. Dice 176 will become securely connected (see FIG. 1E). The temperature of the oven could be as high as 300° C. However, curing is preferably being carried out at 150° C. or lower.

Step 6: The electrodes-dice-wire assembly is enclosed by an enclosure 190 (see FIG. 1F). Enclosure 190 could be an epoxy enclosure or a light diffusion enclosure.

Figure 4A:
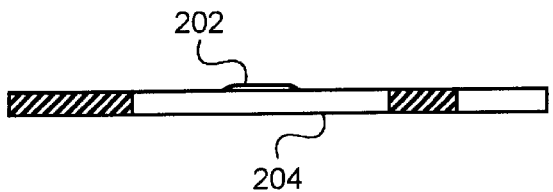
FIGS. 4A–4F show the various stages of another embodiment of the present invention combining conventional wire bonding with the method of the present invention.
Figure 4B:
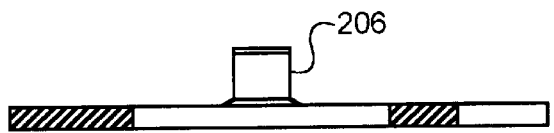
Figure 4C:
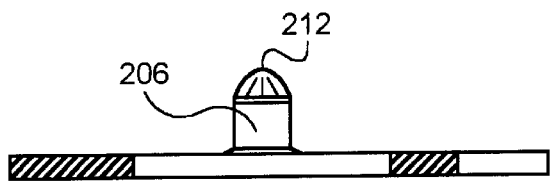
Figure 4D:
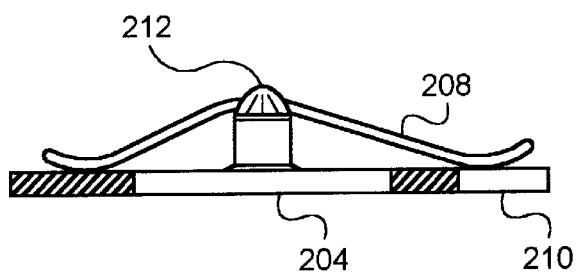
Figure 4E:
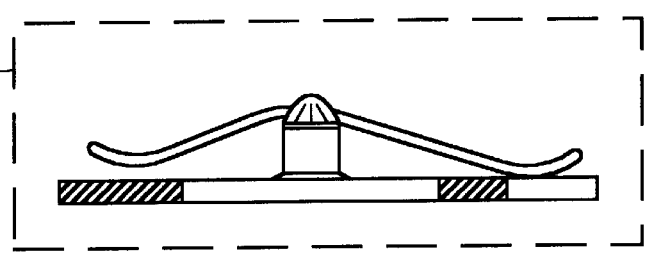
Figure 4F:
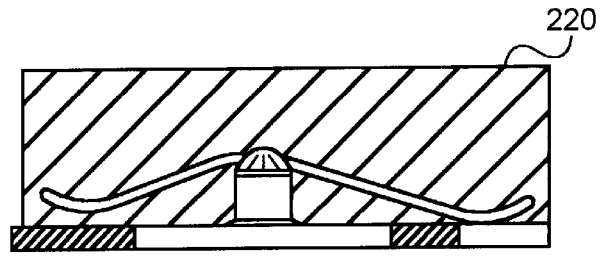

FIGS. 4A–4F illustrate a fourth example using the method of the present invention. This example is similar to the third example. FIGS. 4A and 4B are similar to FIGS. 3A and 3B. Thus, a conductive silver paste 202 is deposited on a surface of a first electrode 204 (see FIG. 4A). A dice 206 is attached onto electrode 204 using silver paste 202 (see FIG. 4B). A silver paste 212 is applied to the top of dice 206 (see FIG. 4C). This step is similar to step 4 of the first example (see FIG. 1D), and is different from step 3 of the third example (see FIG. 3C). A wire 208 is bonded to the surface of another electrode 210 using a conventional wire-bonding machine. Wire 208 is pulled over the top of paste drop 212, thereby connecting wire 208 with dice 206 without physically touching each other. In this method, however, dice 206 is preferably sitting at a slightly higher location (compared to electrodes 204 and 210) so that wire 208 can bend down, touch, and submerge into paste 212 naturally as it is pulled over dice 206 (see FIG. 4D). In so doing, wire 208 would not separate from dice 206 when it is cut, thus eliminating the painstaking step of pressing down wire 208, as is the case in the third example. The electrode-dice-wire assembly is placed in an oven 218 (see FIG. 4E) and then enclosed by an enclosure 220 (see FIG. 4F). The temperature of the oven could be as high as 300° C. However, curing is preferably being carried out at 150° C. or lower.

Figure 5:
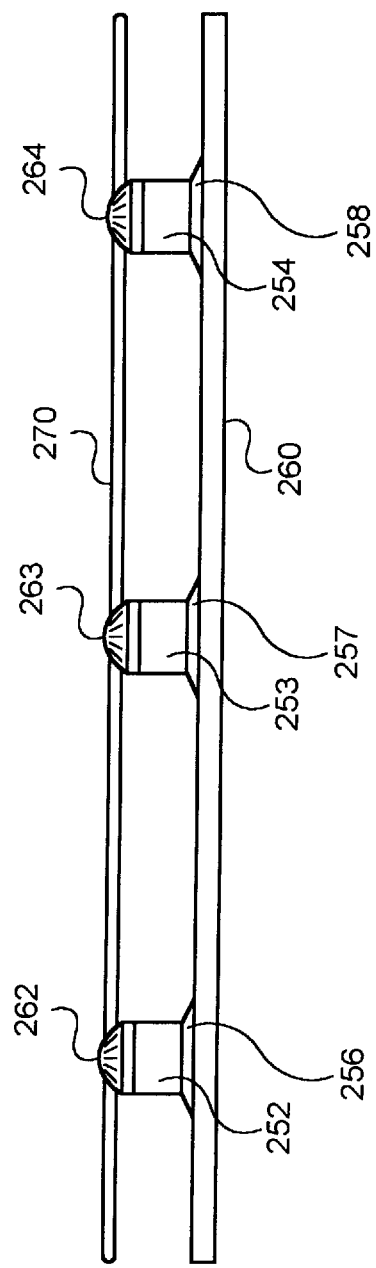
FIG. 5 shows an embodiment of the present invention for bonding multiple dices.

The method of the present invention can also be applied to a structure having multiple dices. An example of the dices are LD array. A fifth example, shown in FIG. 5, illustrates this method. A plurality of dices, such as dices 252–254 are attached to a circuit board 260 (using, e.g., conductive silver pastes 256–258, respectively). Silver pastes 262–264 are deposited on top of dices 252–254. A lead wire 270 is adhered to these pastes 262–264 using the methods disclosed above.

It can be seen that the present invention reduces the time needed for the wire-bonding of multiple dices. As shown in FIG. 5 when more than two dices are to be interconnected, a conducting paste is applied to the top surface of each dice after they have been firmly attached. If the arrangement is linear and the height of each dice is comparable, they can be connected at once by laying a wire of proper length on top of them.

One major advantage of the present invention is that it can alleviate the dislocation or damages often encountered in conventional impact-type, wire-bonding method, thereby greatly improves the yield. Another major advantage of the above invention shows up when the location or contact of a wire is found unacceptable after the wire laying is done. The lead wire can be picked up and relocated easily without causing damage to the dice. Basically, the rework can be performed almost at will as long as the paste is not yet solidified. This kind of flexible adjustment can substantially reduce the failure rate.

Although the above examples are all related to the wire-bonding of optoelectronic devices, a skillful person may easily apply this approach in making various kinds of micromechanisms, devices, components as well as products. The invention has implications far beyond the scope of these examples.

The invention now being fully described, it will be apparent to one of ordinary skill in the art that any changes and modifications can be made thereto without departing from the spirit or scope of the invention as set forth herein. Accordingly, the present invention is to be limited solely by the scope of the appended claims.

What is claimed is:

1. A method for electrically connecting a device to a first and a second conductive surface, comprising the steps of:
   (a) applying a first conductive paste to said first conductive surfaces;
   (b) attaching a bottom surface of said device to said first conductive surface;
   (c) applying a second conductive paste having a ball diameter of less than 150 $\mu$m to a top surface of said device;
   (d) applying a third conductive paste to said second conductive surface; and (e) attaching a conductive wire having a diameter less than 100 μm to said second and said third conductive paste.

2. The method of claim 1 further comprising the step of curing said first conductive paste after said step of attaching said bottom surface.

3. The method of claim 1 further comprising the step of curing said second and said third conductive pastes after said step of attaching said conductive wire.

4. The method of claim 2 wherein said curing step is performed at a temperature approximately equal to or below 150° C.

5. The method of claim 3 wherein said curing step is performed at a temperature approximately equal to or below 150° C.

6. The method of claim 1 wherein one of said first and said second conductive surfaces is an electrode.

7. The method of claim 1 wherein one of said first and said second conductive surfaces is a circuit board.

8. The method of claim 1 wherein said device is an integrated circuit.

9. The method of claim 1 wherein said device is a LED.

10. A method for electrically connecting a device to a first and a second conductive surface, comprising the steps of:

(a) applying a first conductive paste to said first conductive surface;

(b) attaching a bottom surface of said device to said first conductive surface;

(c) attaching a conductive wire to said second conductive surface using a wire-bonding machine;

(d) pulling said conductive wire towards a top surface of said device; and (e) applying a second conductive paste to said top surface and said wire.

11. The method of claim 10 further comprising the step of curing said second conductive paste after said step of applying said second conductive paste.

12. The method of claim 11 wherein said curing step is performed at a temperature approximately equal to or below 150° C.

13. The method of claim 10 wherein said device is an integrated circuit.

14. The method of claim 10 wherein said device is a LED.

* * * * *